United States Patent
Egger et al.

(10) Patent No.: US 7,098,142 B2
(45) Date of Patent: Aug. 29, 2006

(54) METHOD OF ETCHING FERROELECTRIC DEVICES

(75) Inventors: Ulrich Egger, Kanagawa-ken (JP); Haoren Zhuang, Tokyo-to (JP); Rainer Bruchhaus, Kanagawa-ken (JP)

(73) Assignee: Infineon Technologies AG, Munich (DE)

( * ) Notice: Subject to any disclaimer, the term of this patent is extended or adjusted under 35 U.S.C. 154(b) by 401 days.

(21) Appl. No.: 10/377,083

(22) Filed: Feb. 26, 2003

(65) Prior Publication Data

US 2004/0164050 A1     Aug. 26, 2004

(51) Int. Cl.
*H01L 21/302*   (2006.01)
*H01L 21/461*   (2006.01)

(52) U.S. Cl. .................. 438/714; 438/717; 438/720
(58) Field of Classification Search ........ 438/551–555, 438/714, 717, 720
See application file for complete search history.

(56) References Cited

U.S. PATENT DOCUMENTS

| | | | |
|---|---|---|---|
| 6,165,909 A | 12/2000 | Linliu | |
| 6,235,573 B1 | 5/2001 | Lee et al. | |
| 6,288,423 B1 | 9/2001 | Sugaya | |
| 6,500,678 B1 | 12/2002 | Aggarwal et al. | |
| 6,573,167 B1 * | 6/2003 | Xing et al. | 438/552 |
| 2001/0022372 A1 | 9/2001 | Kanaya et al. | |
| 2001/0041416 A1 * | 11/2001 | Torii et al. | 438/396 |
| 2002/0006674 A1 * | 1/2002 | Ma et al. | 438/3 |
| 2003/0022494 A1 * | 1/2003 | Ying et al. | 438/689 |
| 2004/0072442 A1 * | 4/2004 | Celii et al. | 438/710 |

FOREIGN PATENT DOCUMENTS

WO      WO03/012838     2/2003

* cited by examiner

*Primary Examiner*—Duy-Vu N. Deo
(74) *Attorney, Agent, or Firm*—Fish & Richardson P.C.

(57) ABSTRACT

A method of etching a ferroelectric device 100 having a ferroelectric layer 112 between a top and a bottom electrode 114, 108 is disclosed herein. Hardmasks 116, 118 are deposited on the top electrode 114, two or more hardmasks being spaced apart by narrow first regions 115 and spaced apart from other hardmasks by wider second regions 117. The top electrode 114 and ferroelectric layer 112 are then etched to pattern the top electrode 114 thus forming capacitors 102, 104, and the bottom electrode 108 is etched by a process in which the second regions are etched more slowly than the second regions. Those capacitors having a first region between them have a common bottom electrode 108, but in the second regions the bottom electrode is severed. To pattern the bottom electrode 108, a fluorine-based chemistry followed thereafter by a CO-based chemistry are used in a two step etching process.

6 Claims, 3 Drawing Sheets

METHOD OF ETCHING FERROELECTRIC DEVICES

BACKGROUND OF THE INVENTION

This invention relates to a method of etching ferroelectric structures to form ferroelectric capacitors having a common bottom electrode.

FIELD OF THE INVENTION

A known electronic device includes ferroelectric capacitors formed from a top electrode layer, a ferroelectric layer and a bottom electrode layer. The bottom electrode layer is adhered to a substrate using adhesive such as a Ti glue layer. Between the Ti glue layer and the bottom electrode can be layers of Ir (iridium), IrO2 (Iridium Oxide) or other materials for blocking oxygen diffusion. Poly silicon contact plugs pass through the substrate to form electrical connections between the bottom electrode and a lower region of the structure including electronic components.

In some applications it is desired for a group of the ferrocapacitors to share a bottom electrode (i.e. such that the bottom electrode extends continuously between the ferrocapactors), while the bottom electrode layer is removed other than between the group of ferrocapacitors. To form this structure, the top electrode layer, ferroelectric layer and bottom electrode layer are typically patterned to form the individual ferroelectric capacitors in two steps. In the first step the top electrode (TE) is covered with a first TEOS hardmask made up of hardmask elements, and the hard mark elements are used to perform mask resist strip patterning of the top electrode and ferroelectric layer. In the etched regions, the bottom electrode is exposed. In the second step, a second TEOS hardmask is deposited over the structure to cover part of the exposed region of the bottom electrode. The remaining portions of the bottom electrode are then etched, leaving the bottom electrode intact in the regions covered by the second mask and severed between those regions.

This double etching process thus requires two different steps of lithographic mask deposition. This increases the fabrication complexity. Furthermore, there may be an overlay problem between the first hardmask and the second hardmask, and an additional fringe around the top electrode stack is typically necessary to alleviate this problem, which results in a larger cell size for the capacitor.

SUMMARY OF THE INVENTION

It is an object of the present invention to provide a new and useful etching method, and one which aims to alleviate at least one of the disadvantages of the prior art.

In general terms, the present invention proposes that a structure comprising a bottom electrode, a ferroelectric layer and top electrode, is partially covered by mask elements. Some pairs of adjacent mask elements are spaced apart by first regions and other pairs of adjacent mask elements are spaced apart by second regions, the first regions being narrower than the second regions. The structure is then etched. During at least the etching of the bottom electrode layer, an etching technique is used which is more effective in the second regions than the first regions, so that the bottom electrode layer is completely removed only in the second regions.

Specifically, a first aspect of the invention is a method of etching a ferroelectric device having a ferroelectric layer between a top electrode layer and a bottom electrode layer, the method comprising the steps of:

depositing over the top electrode layer hardmask elements, two or more hardmask elements being spaced apart pairwise by first regions and spaced apart from other hardmask elements by second regions, the first regions being narrower than the second regions; and etching the structure using, during at least the etching of the bottom electrode layer, an etching technique which is more effective in the second regions than the first regions, the bottom electrode layer being completely removed only in the second regions.

An advantage of the described embodiment of the invention is that the described embodiment obviates the need for an additional hardmask and lithography step for the bottom electrode. This will also avoid the overlay problems between the two hardmasks of the prior art since only one hardmask is required.

One such etching technique is a two-step technique having a first etching step (such as one with a fluorine-based chemistry) in which the bottom electrode is etched but a protective deposit is formed which tends to protect the bottom electrode in the first regions, followed by a second etching step (such as one based on CO chemistry) in which the deposits are removed.

Preferably the first step uses a fluorine-based chemistry, and the second step uses a CO-based chemistry.

Preferably, the method further comprises the step of forming a protection layer on the hardmask, sidewalls of the top electrode and the ferroelectric layer, and on the bottom electrode, prior to the etching of the bottom electrode. Typically, the protection layer comprises $Al_2O_3$ and may be deposited using atomic layer deposition.

When a protection layer is formed, the method may further comprises a step of anisotropically etching the protection layer so that only the sidewall portions of the top electrode and the ferroelectric layer remain.

In a second aspect, the invention provides a method of etching a ferroelectric device having a ferroelectric layer between a top and a bottom electrode, the method comprising the steps of:

depositing over the top electrode a hardmask;

etching the top electrode and ferroelectric layer; and etching the bottom electrode by a two-step technique firstly using a fluorine-based chemistry, and thereafter a CO-based chemistry.

BRIEF DESCRIPTION OF THE DRAWINGS

An embodiment of the invention will now be described, by way of example, with reference to the accompanying drawings in which.

DETAILED DESCRIPTION OF THE PREFERRED EMBODIMENT

FIGS. 1 to 6 show a ferroelectric device 100 at different stages of a method according to the present invention.

Figure 1:
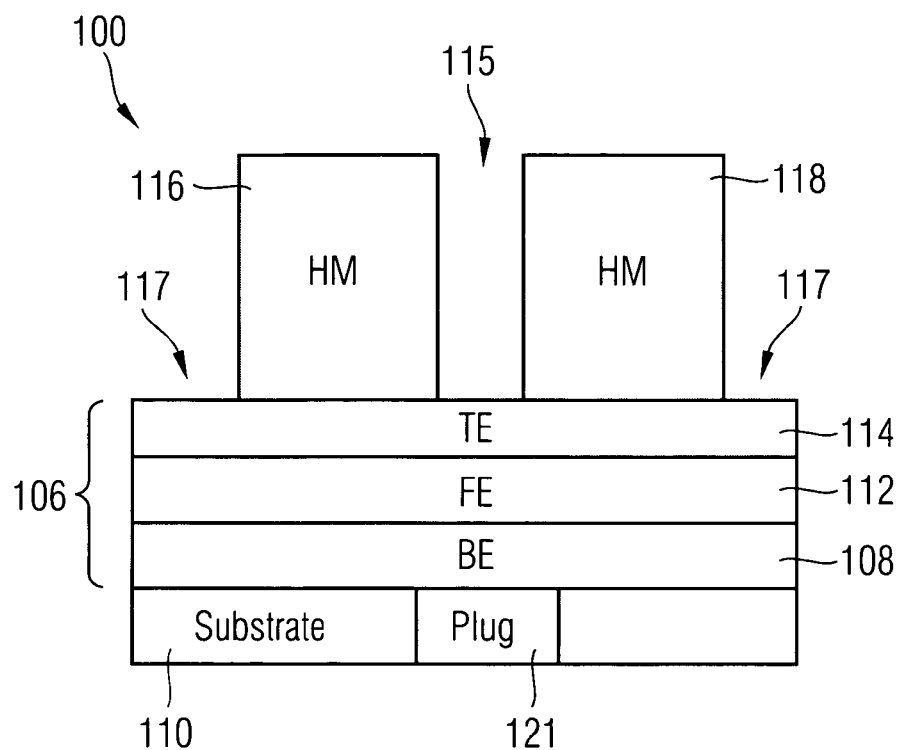
FIG. 1 illustrates a ferroelectric device having a bottom electrode layer, ferroelectric layer, top electrode layer, and two hardmasks deposited on the top electrode for forming two respective ferroelectric capacitors.

The structure of FIG. 1 includes a ferroelectric stack 106, made up of a bottom electrode (BE) layer 108 deposited on a substrate 110, a ferroelectric layer (FE) 112 deposited on the bottom electrode layer 108, and a top electrode (TE) 114 deposited on the ferroelectric layer 112. The bottom electrode layer is typically made of Ir (Iridium) film and/or IrO2 (Iridium Oxide) or other materials which act as a barrier layer for blocking oxygen diffusion. The bottom electrode layer 108 rests on a substrate 110 which includes a polysilicon plug 121 electrically connecting the bottom electrode layer 108 to lower layers of the structure (not shown).

Two spaced hardmasks (HM) 116, 118 are subsequently deposited on the top electrode layer 110, as shown in FIG. 1. The hardmasks are typically made of TEOS (Tetraethyl Orthosilicate) material. It is to be understood that the hardmasks 116, 118 are two of a very large number of hardmasks deposited in an array over the top electrode. Some of these hardmasks (such as the pair of hardmasks 116, 118) have a relatively narrow space between them, but other pairs of the hardmasks (such as each of the elements 116, 118 and its nearest neighbour hardmask element on the other side) have a relatively wide space between them. The region between the relatively proximate pair of hardmasks 116, 118 is here referred to as a "first region" 115, while the areas to either side of the pair of hardmask areas 116, 118 are referred to as "second regions" 117.

Figure 2:
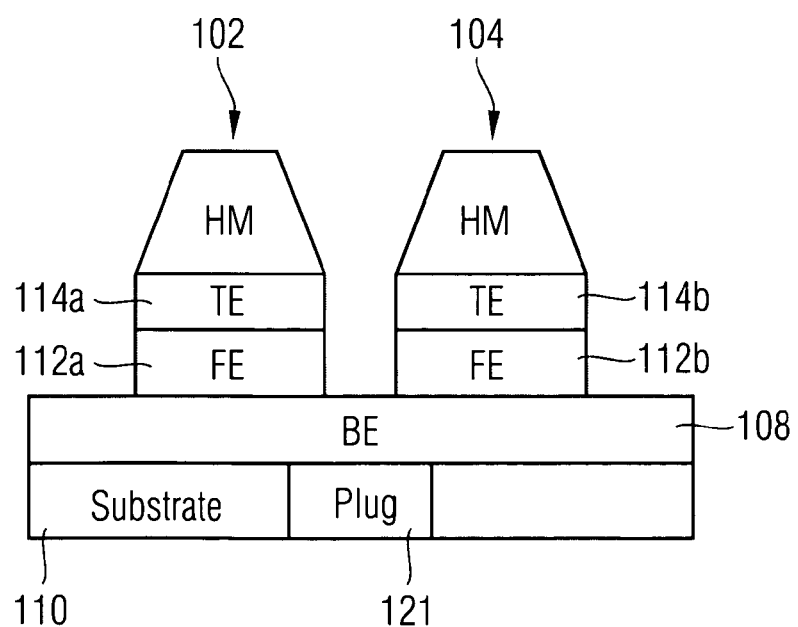
FIG. 2 illustrates the ferroelectric device of FIG. 1 after etching of the top electrode and the ferroelectric layer.

To pattern the top electrode 114 and ferroelectric layer 112, a similar etching process as that in the prior art is used and the end result is shown in FIG. 2.

As shown in FIG. 2, the structure now includes two ferroelectric capacitors 102, 104 having a common bottom electrode 108 but separate top electrodes 114a, 114b and ferroelectric layers 112a, 112b.

Figure 3:
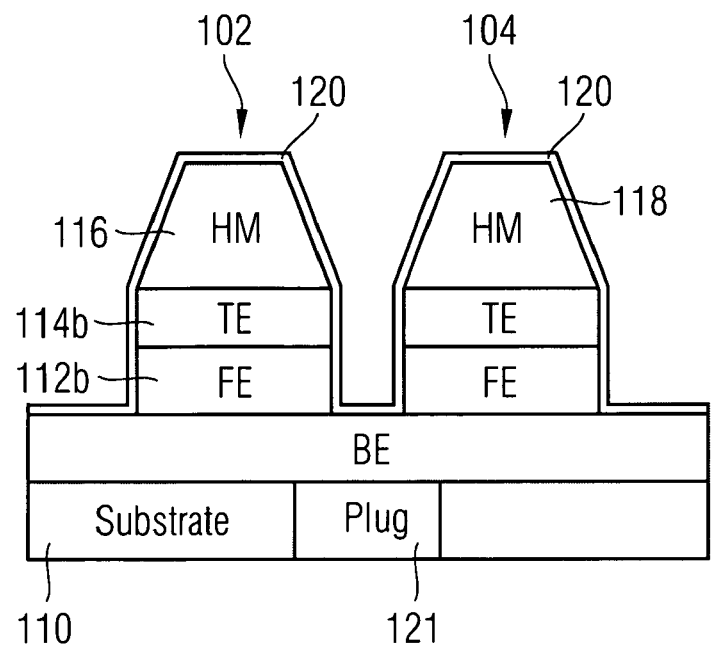
FIG. 3 illustrates the ferroelectric device of FIG. 2 after depositing a protection layer.

As described below, an etching process based on fluorine-based chemistry will be used later in the process. If the material of the ferroelectric layer 120 is sensitive to the fluorine-based chemistry, for example if PZT (lead zirconate titanate) is used as the ferroelectric layer 112, then two steps are preferably performed illustrated in FIGS. 3 and 4. As shown in FIG. 3, a protection layer 120 is first deposited to encapsulate the two capacitors 102, 104 as shown in FIG. 3. The protection layer 120 can be $Al_2O_3$ or other suitable composition such as $TiO_2$. For an improved coverage, atomic layer deposition is preferred instead of PVD (physical vapour deposition) or CVD (chemical vapour deposition) which are also suitable.

Figure 4:
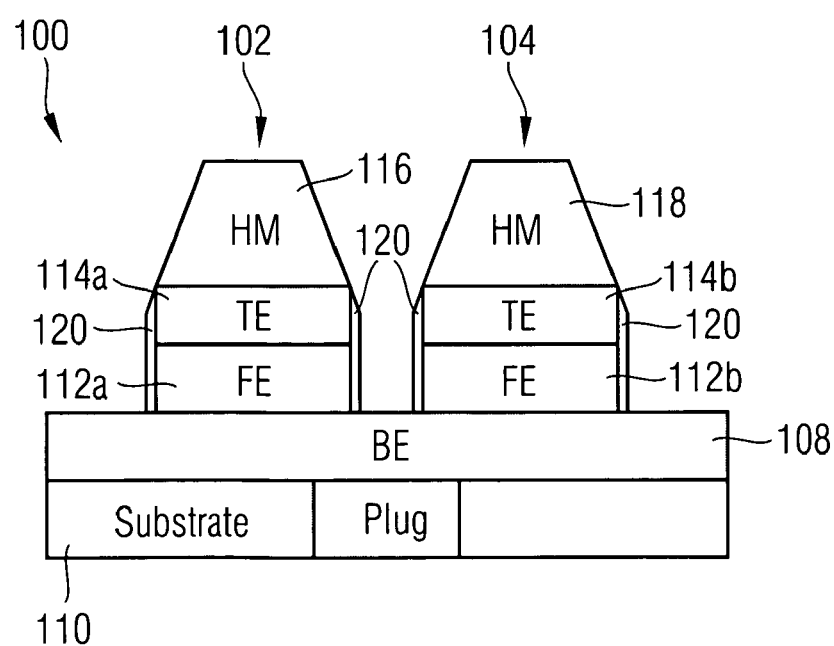
FIG. 4 illustrates the ferroelectric device of FIG. 3 after removing the protection layer on the hardmasks and the bottom electrode.

The protection layer 120 deposited on the horizontal areas, i.e. on the bottom electrode 108 and the hardmasks 116, 118, is removed prior to etching of the bottom electrode 108. The selective removal of the protection layer 120 is performed by anisotropically etching these areas using appropriate etching conditions so that only sidewall portions remain. As shown in FIG. 4, this results in the two capacitors having the protection layer 120 covering the vertical portions to protect sidewalls of the top electrodes 114a, 114b and the ferroelectric layers 112a, 112b. In addition, if the chemistry used has a good selectivity to Ir, this will also help to reduce unwanted Ir residues from being deposited on the sidewalls.

Figure 5:
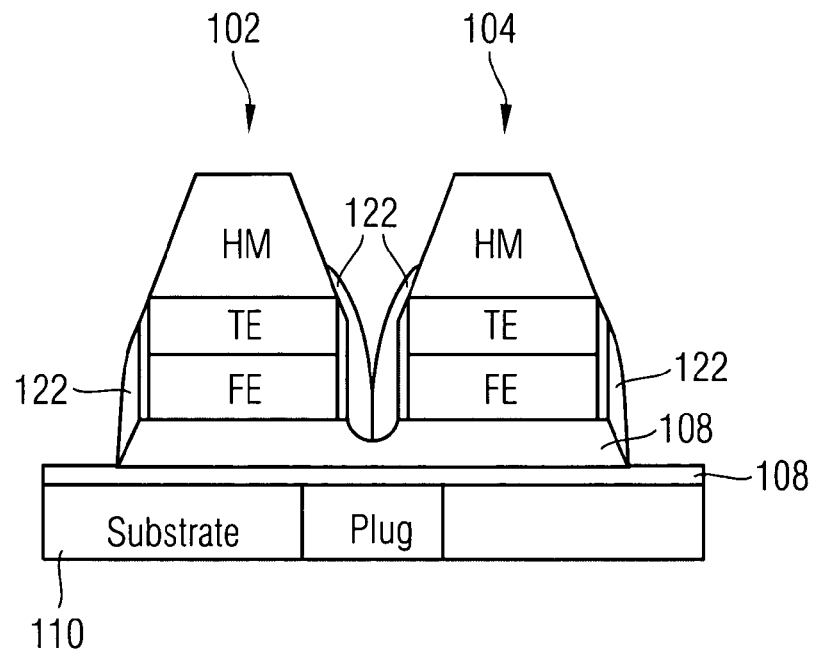
FIG. 5 illustrates the ferroelectric device of FIG. 4 after etching of the bottom electrode using fluorine-based chemistry.

Next, the common bottom electrode 108 is etched in two steps (without an additional hardmask). FIG. 5 shows the first step of etching partially the bottom electrode 108 to remove Ir-based barrier layers using a fluorine-based chemistry.

Suitable gases for use in the fluorine-based etching of the bottom electrode 108 include Carbon Tetrafluoride ($CF_4$) and Sulfur Hexafluoride ($SF_6$) which are hydrogen free. During this step, a thick porous Ir fence 122 forms on the sidewalls as shown in FIG. 5. The bottom electrode 108 is tapered under the fence 122 since the fence 122 acts like a gradually widening hardmask. If the distance between the two capacitors 102, 104 is of the same size as the sidewall fence 122 formed during the fluorine-based etching, the etching of the area between the two capacitors 102, 104 stops as the two fences 122 on the opposing sidewalls begin to touch each other.

However, the etching of the outer sidewalls continues. When the bottom electrode 108 (not covered by the Ir fence 122) has been etched by about 80% to 90% (which is the stage shown in FIG. 5), the gas chemistry is changed to a CO-based chemistry such using as CO (90%) and $Cl_2$ (10%) mixture, which is the second step in the etching process of the bottom electrode. The CO-based etching removes the glue layer (such as Ti, TiN) and also removes the fence 122 formed on the sidewalls of the capacitors 102, 104. The etching may also over-etched into the substrate 110, which typically comprises TEOS material.

Figure 6:
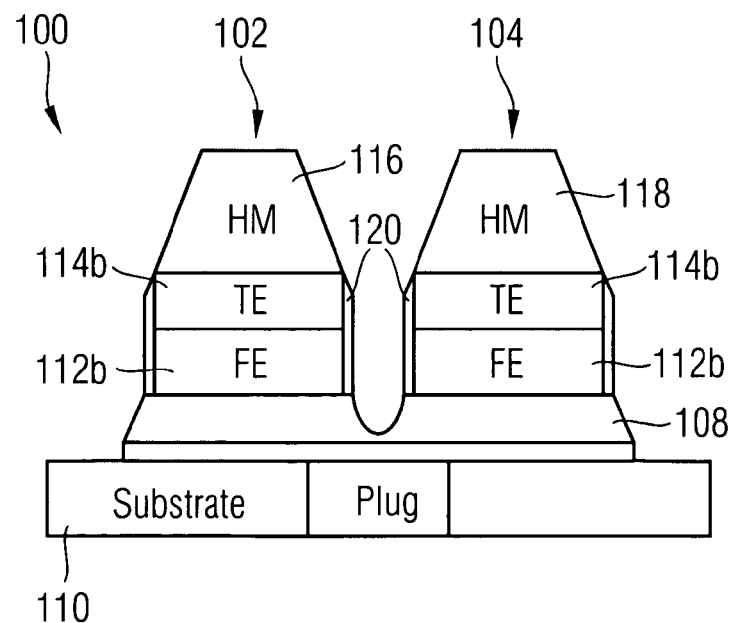
FIG. 6 illustrates the ferroelectric device of FIG. 5 after etching the bottom electrode using CO-based chemistry.

As shown in FIG. 6, this results in two capacitors 102, 104 having a common bottom electrode 108 since the bottom electrode extends across the "first regions" between the capacitors, but with the bottom electrode being severed to either side of the pair of capacitors (i.e. in the "second regions"). An additional wet cleaning step may be used to remove any residual Ir fence remnants still left on the sidewalls. This etching step can be carried out using commercial EKT solution (available from EKC Technology Inc.) can be used for the cleaning. For example, EKC270, at a temperature of room temperature to 90° C. and a time of less than 30 seconds.

The above two step etching process thus obviate the need for an additional hardmask and lithography step to form a bottom electrode 104 which has been partially removed, and thus a ferroelectric capacitor (or device) formed using the present method will only require one layer of hardmask. This will also avoid the overlay problems between the two hardmasks of the prior art since only one hardmask is required. In this way, the ferroelectric device, in particular ferroelectric capacitors used in FeRAM devices, can be made with a smaller cell size.

The described embodiment should not be construed as limitative. Many variations of the embodiment are possible within the scope of the invention as will be clear to one of ordinary skill in the art. For example, other materials may be used for the bottom electrode and thus the fence 122 that forms on the sidewalls may not be Ir-based. In this case, the etching chemistry proposed above (F-based firstly, and CO-based secondly) may or may not be applicable.

Also, although in FIGS. 1 to 6, only two capacitors 102, 104 are shown, there may be any number of capacitors spaced apart pairwise by relatively narrow first regions 115, and separated from all other groups of capacitors by second regions. There may be any number of capacitors in groups defined such that all pairs of adjacent capacitors within the group are spaced apart by the relatively narrow first regions.

Furthermore, although only first regions and second regions have been described, it is not necessary for all the first regions to be of the same width as each other, or for all the second regions to be of the same width as each other. Rather, the first regions may have different widths such that all are sufficiently narrow so that the bottom electrode is not entirely removed in those regions, and the second regions may have different widths such that all are sufficiently wide that the bottom electrode is entirely removed in those regions.

What is claimed is:

1. A method of etching a ferroelectric device having a ferroelectric layer between a top electrode layer and a bottom electrode layer, the method comprising the steps of:
    depositing a plurality of hardmask elements over the top electrode layer, two or more of said hardmask elements being spaced apart pairwise by first regions and spaced apart from other hardmask elements by second regions, the first regions being narrower than the second regions;
    etching the device using, during at least the etching of the bottom electrode layer, a two-step etching technique having a first etching step in which the bottom electrode is etched but a protective deposit is formed which protects the bottom electrode in the first regions from further etching, followed by a second step in which the deposits are removed, said technique being more effective in the second regions than the first regions, the bottom electrode layer being completely removed only in the second regions; and
    forming a protection layer on the hardmask, sidewalls of the top electrode and the ferroelectric layer, and on the bottom electrode, prior to the patterning of the bottom electrode.

2. A method according to claim 1 in which the first etching step comprises etching using a fluorine-based chemistry; and the second step comprises etching the remaining bottom electrode using a CO-based chemistry.

3. A method according to claim 1 wherein the protection layer is deposited using atomic layer deposition.

4. A method according to claim 1 wherein the protection layer comprises $Al_2O_3$.

5. A method according to claim 1, further comprising the step of anisotropically etching the protection layer so that only the sidewall portions of the top electrode and the ferroelectric layer remain.

6. A method according to claim 2 further comprising the step of wet cleaning the ferroelectric device after the CO-based chemistry etching.

* * * * *